(12) United States Patent
Heo

(10) Patent No.: US 10,135,277 B2
(45) Date of Patent: Nov. 20, 2018

(54) SYSTEM AND METHOD FOR RAPIDLY CHARGING BATTERY WHILE CONSIDERING THERMAL STABILITY

(71) Applicant: TWOMI CO., LTD., Ansan (KR)

(72) Inventor: Kwon Heo, Bucheon (KR)

(73) Assignee: TWOMI CO., LTD., Ansan (KR)

( * ) Notice: Subject to any disclaimer, the term of this patent is extended or adjusted under 35 U.S.C. 154(b) by 11 days.

(21) Appl. No.: 15/316,276

(22) PCT Filed: Nov. 20, 2015

(86) PCT No.: PCT/KR2015/012526
§ 371 (c)(1),
(2) Date: Dec. 5, 2016

(87) PCT Pub. No.: WO2017/086512
PCT Pub. Date: May 26, 2017

(65) Prior Publication Data
US 2017/0271887 A1  Sep. 21, 2017

(30) Foreign Application Priority Data
Nov. 16, 2015 (KR) .......... 10-2015-0160094

(51) Int. Cl.
*H02J 7/00* (2006.01)
*G01R 31/36* (2006.01)
*H01M 10/44* (2006.01)

(52) U.S. Cl.
CPC .......... *H02J 7/007* (2013.01); *G01R 31/362* (2013.01); *G01R 31/3658* (2013.01); *G01R 31/3675* (2013.01); *H01M 10/441* (2013.01); *H02J 7/00* (2013.01); *H02J 7/0052* (2013.01); *H02J 7/0091* (2013.01); *H02J 2007/0096* (2013.01); *Y02E 70/40* (2013.01)

(58) Field of Classification Search
CPC ........ H02J 7/007; H02J 7/008; G01R 31/362; Y02E 60/12
USPC .......................................... 320/153
See application file for complete search history.

(56) References Cited

U.S. PATENT DOCUMENTS

| | | | | |
|---|---|---|---|---|
| 5,795,664 A | * | 8/1998 | Kelly | H01M 10/486 320/150 |
| 6,914,414 B2 | * | 7/2005 | Hamada | H01M 2/1016 320/107 |
| 7,076,375 B2 | * | 7/2006 | Raichle | H02J 7/0052 320/106 |
| 2001/0001533 A1 | * | 5/2001 | Stuck Andersen | H01M 10/44 320/150 |

FOREIGN PATENT DOCUMENTS

KR  10-2016-0109171 A  9/2016

* cited by examiner

*Primary Examiner* — Yalkew Fantu

(57) ABSTRACT

The present invention relates to a rapid charging system and a rapid charging method that consider thermal stability, and according to the present invention, a battery may be rapidly charged by determining a charging current based on the environment of the battery and the state of the battery, and the life span of the battery may be prevented from being shortened, the charging efficiency becomes higher, and the charging time may be reduced by preventing degradation of the battery due to the charging efficiency and the reaction heat of the battery.

6 Claims, 9 Drawing Sheets

[FIG1]
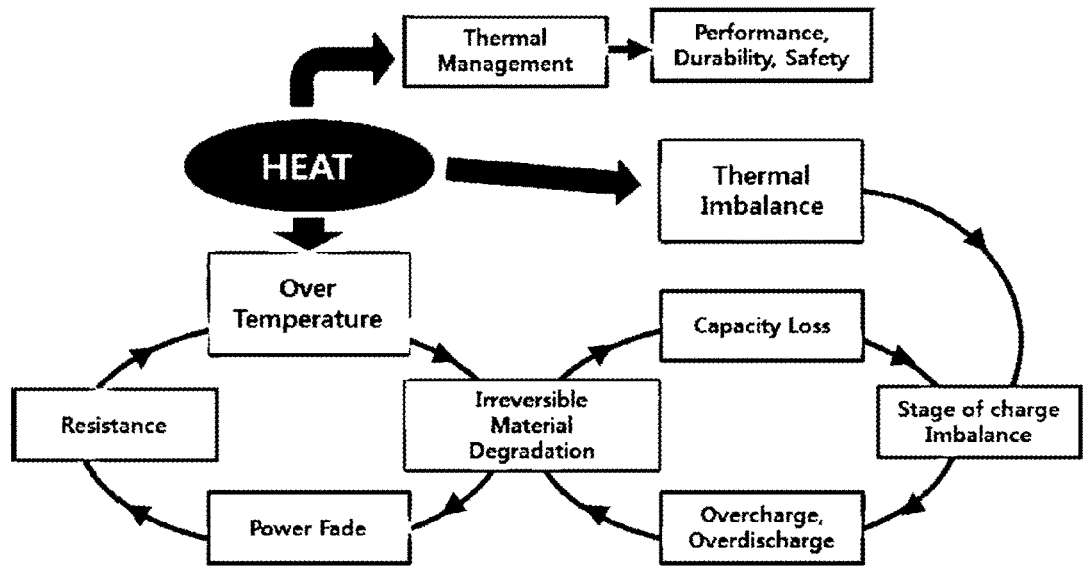
[FIG2]
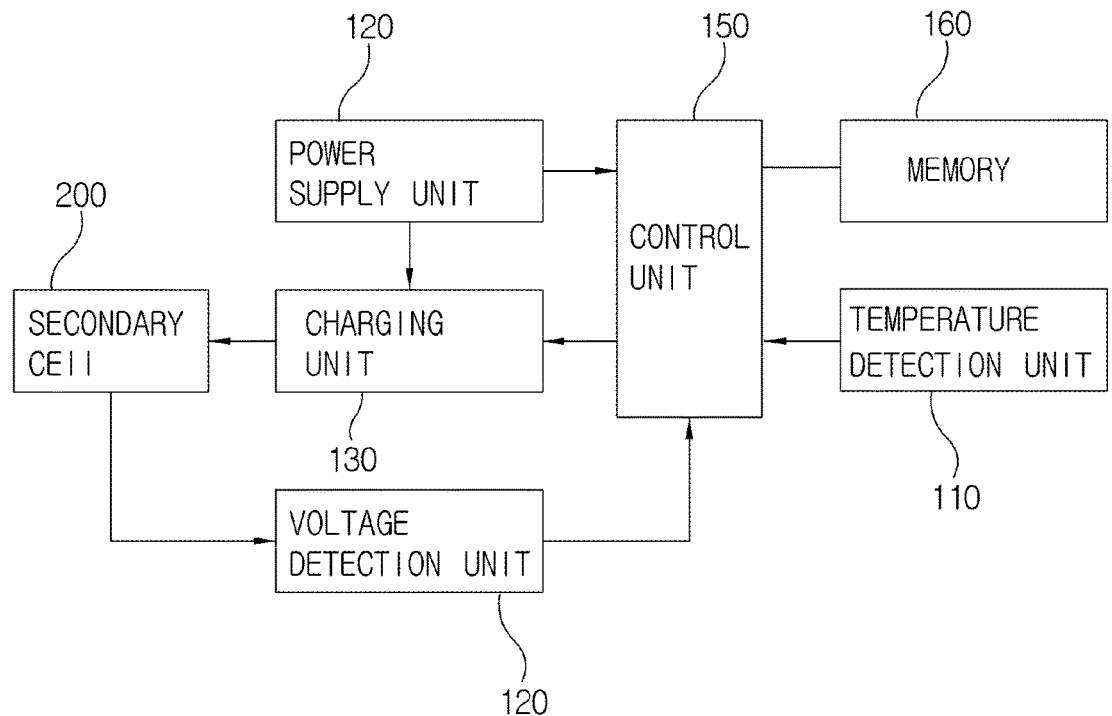

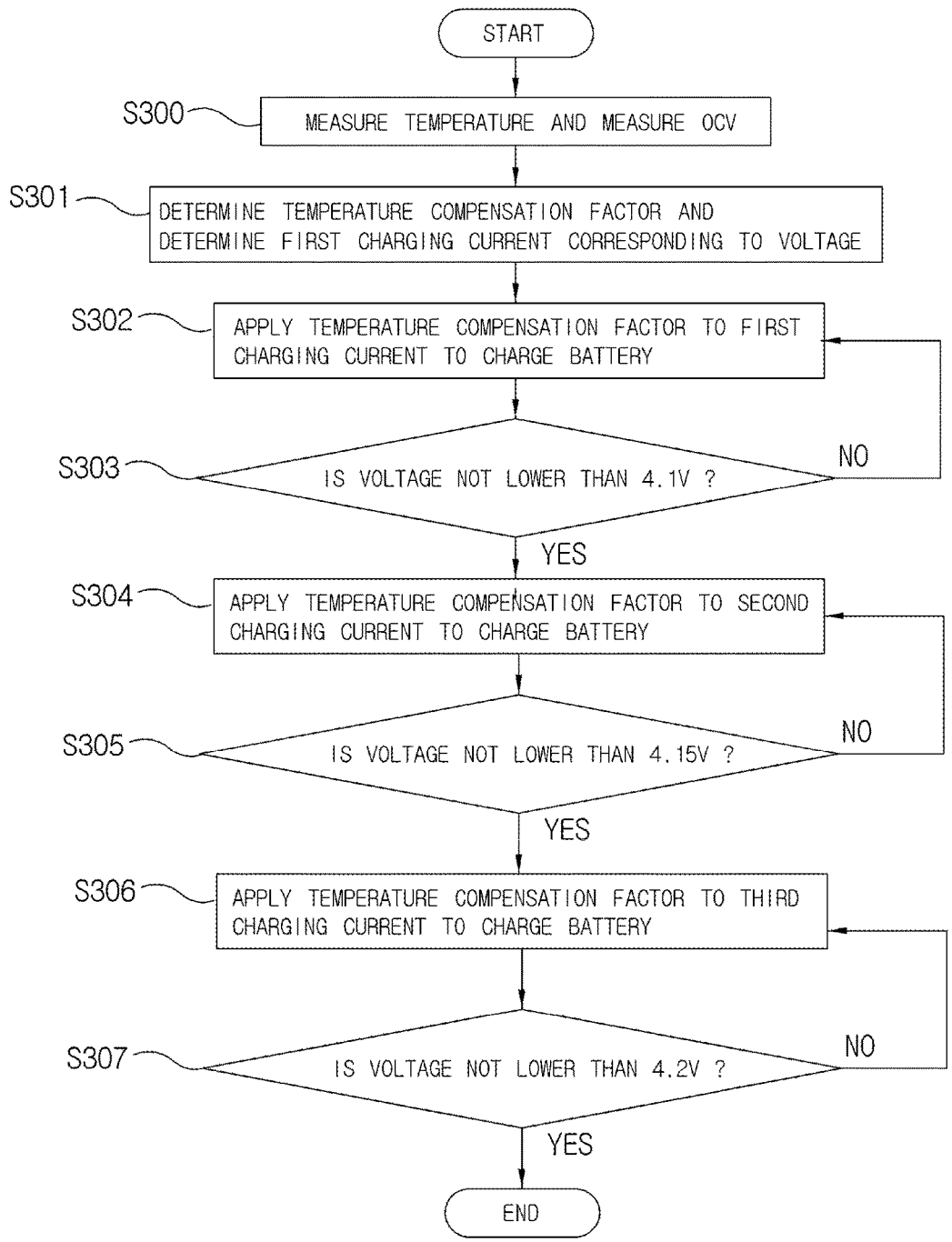

[FIG4]
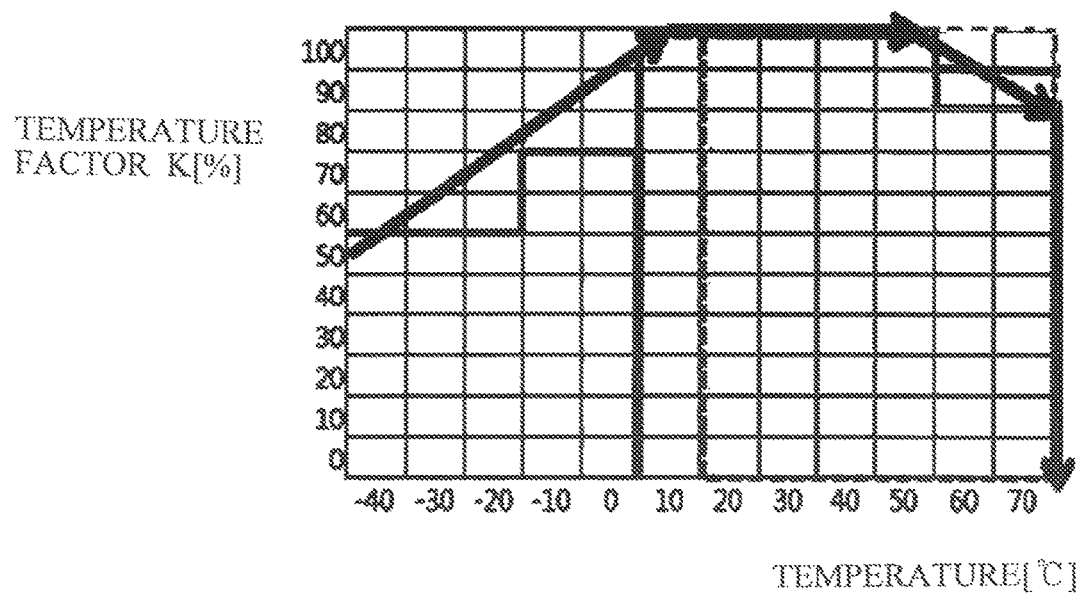
[FIG5]
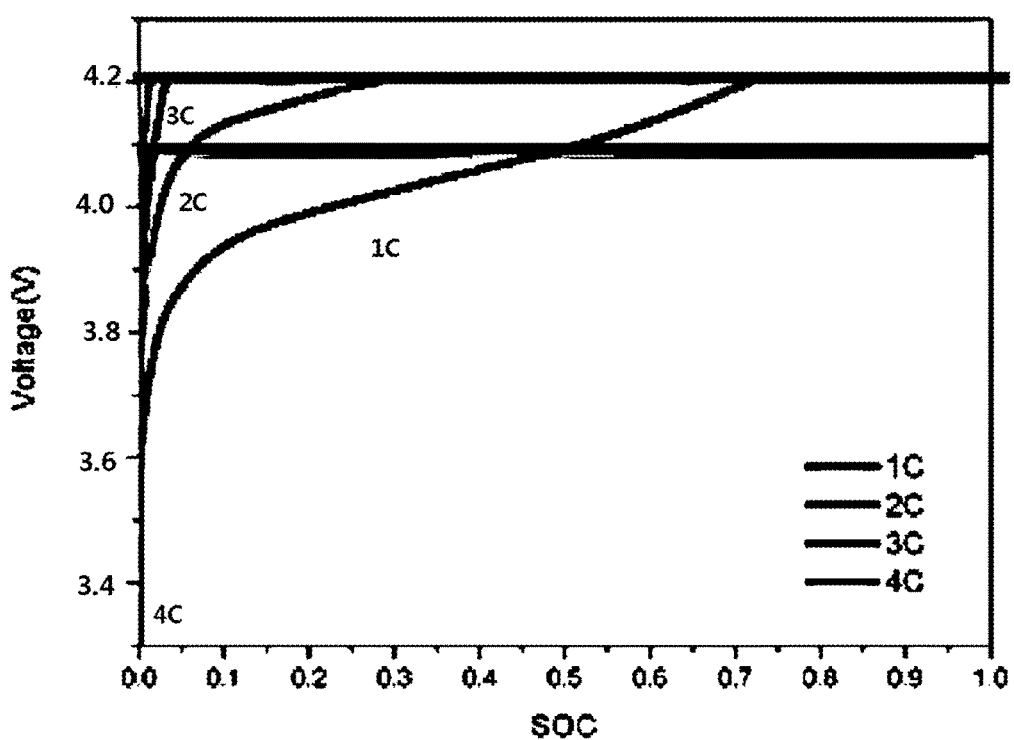

[FIG6]
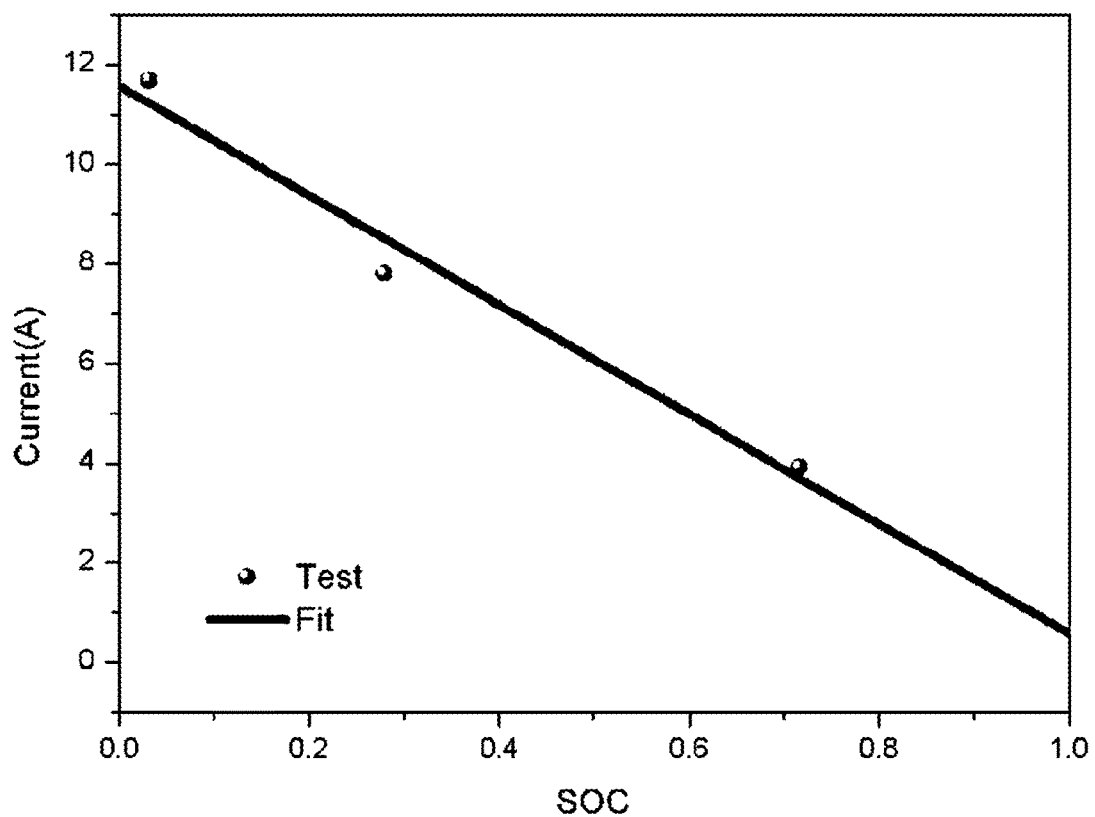

[FIG7]
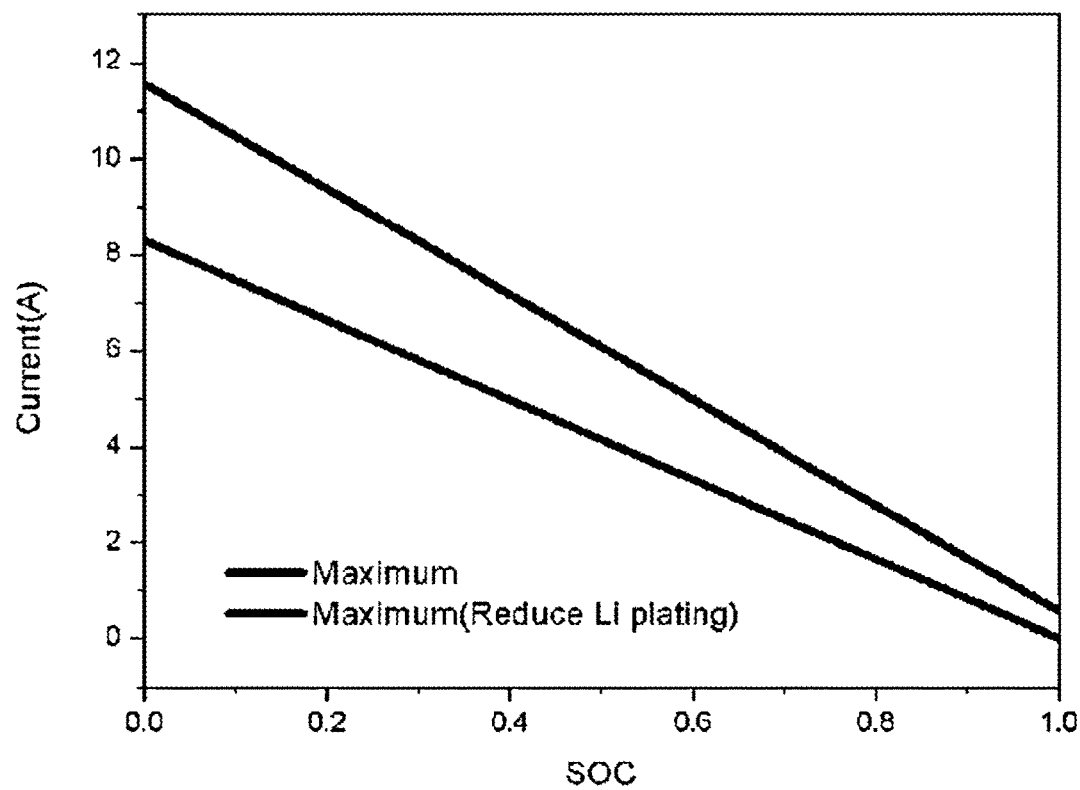

[FIG8]
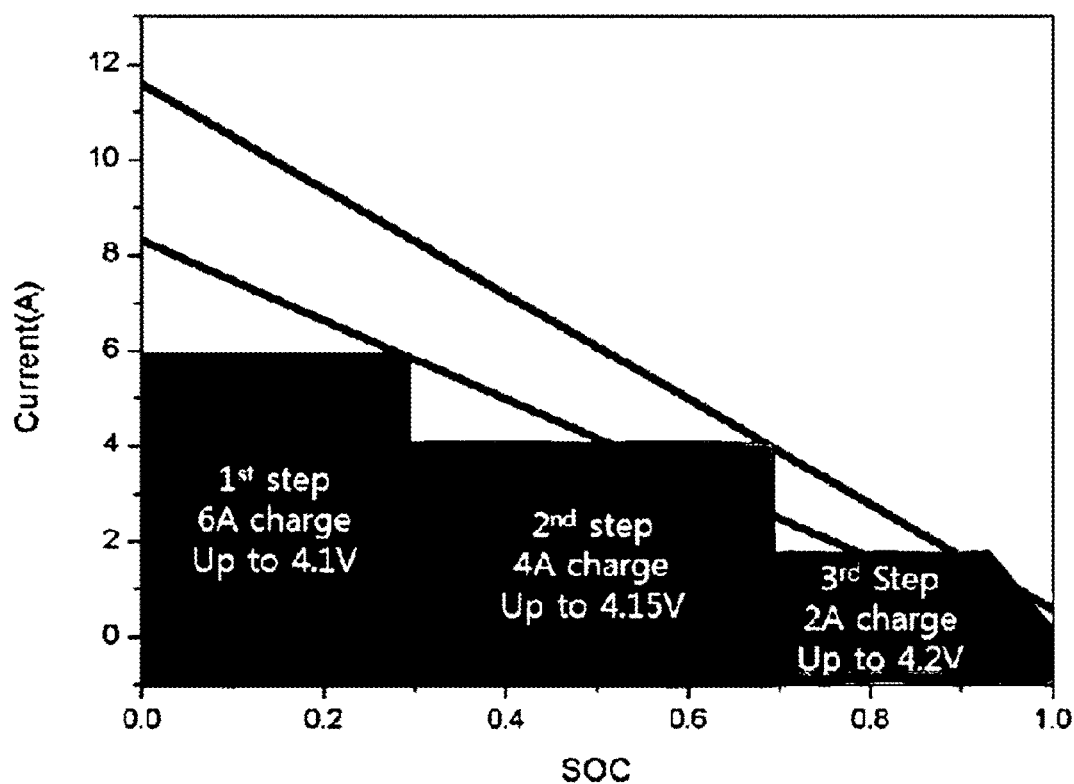

[FIG9]
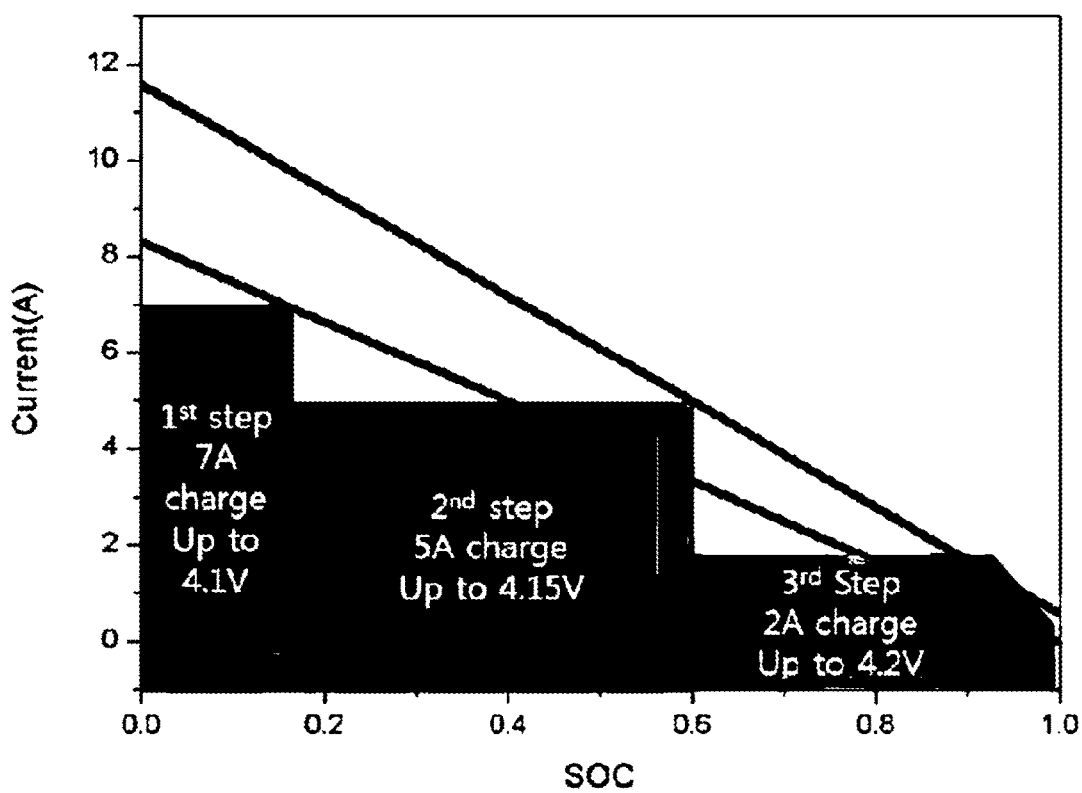

[FIG10]
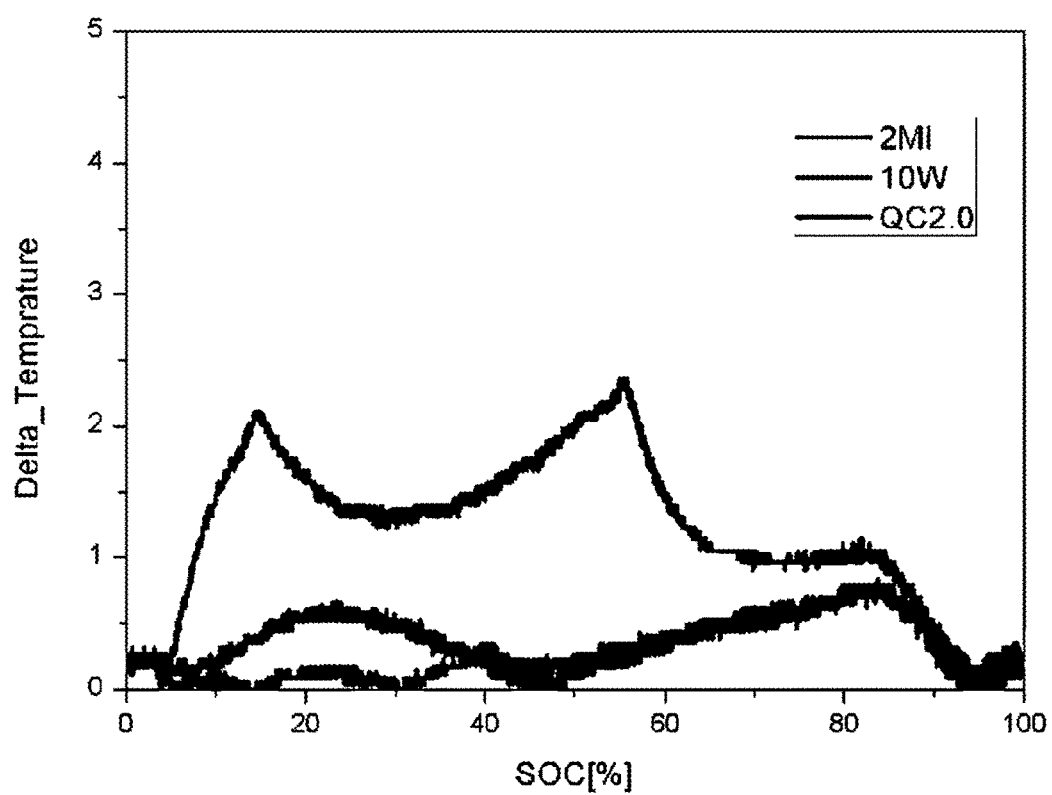

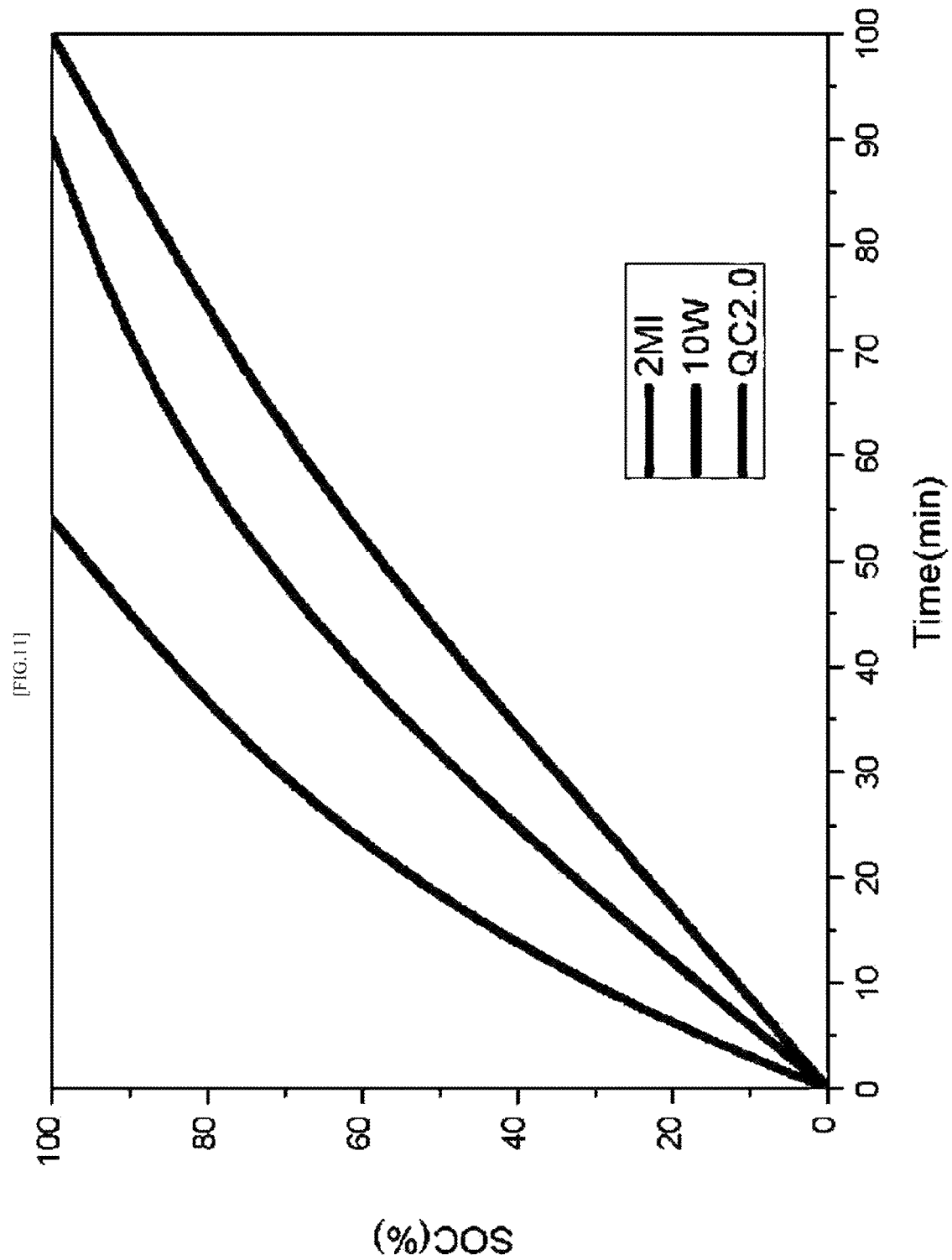

SYSTEM AND METHOD FOR RAPIDLY CHARGING BATTERY WHILE CONSIDERING THERMAL STABILITY

CROSS-REFERENCE TO RELATED APPLICATIONS

The present specification is a U.S. National Stage of International Patent Application No. PCT/KR2015/012526 filed Nov. 20, 2015, which claims priority to and the benefit of Korean Patent Application No. 10-2015-0160094 filed in the Korean Intellectual Property Office on Nov. 16, 2015, the entire contents of which are incorporated herein by reference.

TECHNICAL FIELD

The present invention relates to rapid charging of a battery that is used in a mobile phone, a smartphone, a notebook, a tablet, or a small-sized electric tool, and more particularly to a rapid charging system and a rapid charging method that consider thermal stability for rapid charging a battery used for a smartphone and a tablet in consideration of thermal stability.

BACKGROUND ART

In general, most of mobile small-sized secondary battery markets are occupied by lithium ion batteries and lithium polymer batteries.

The lithium ion batteries and the lithium polymer batteries have high voltages and high energy densities as compared with other batteries. Among them, in the lithium ion battery, a lithium metal oxide is used at a positive electrode and a carbon metal is used at a negative electrode.

Further, the lithium ions of the battery move between the positive electrode and the negative electrode while the battery is charged or discharged.

The mobile secondary battery may be embedded in a device or may be detachably mounted on the device.

The battery chargers for charging the batteries mostly employ a constant current-constant voltage (CC-CV) charging method. In the method, a battery is charged with a constant current for a predetermined period of time and then is charged with a constant voltage if the level of the battery reaches a charging level of a constant voltage.

Most of the rapid charging systems terminate charging at a time point when the battery reaches a constant voltage (CC-CV).

At this time, the charger is generally switched to a charging operation of a low current.

A charging operation of a lower current varies based on an SOC of the battery. Then, the charging speed of the lithium ion battery is adjusted such that the voltage of the battery does not exceed a specific voltage value.

This is known as a constant voltage charging operation of a CC-CV profile.

The lithium ion battery typically is charged by using a CC-CV method.

The CC-CV method algorithm charges the battery up to a specific voltage with a fixed current. Once the voltage of the battery reaches a specific voltage, the charger is switched to a charging current of a low speed. Thereafter, the specific voltage for charging generally is selected by manufacturers.

However, in the conventional rapid charging system using a CC-CV method, as the battery degrades rapidly due to the charging efficiency and the heat emitting reaction of the battery when a current for static current charging is high, the battery manufacturers mostly use charging of a low current (5 W).

However, because the sizes of the displays for a smartphone are increasing from 3 inches to 5 inches while consuming high energy and multi-tasking services and LTE, 3G, and Wi-Fi communications are multiply used, necessary energy increases so that the smartphone users have to frequently charge the batteries.

The currently commercialized mobile devices take a minimum of about two hours to completely charge the battery packs. Further, because power users charge the batteries two or three times after charging the battery, rapid charging is required.

Because a high current is applied for the rapid charging as compared with general charging, the intercalation and deintercalation speeds of the lithium ions in the electrodes cannot sufficiently follow the applied current. Accordingly, the speed of a side reaction that degrades an electrode material becomes higher so that the resistance of the lithium secondary battery increases, and the temperature of the battery excessively increases during a charging operation so that the cycle life span of the lithium secondary battery rapidly decreases.

Accordingly, studies on an optimum charging condition for reducing an increase of temperature of the lithium secondary battery and shortening the charging time of the lithium secondary battery are inevitably necessary to maximize the life span of the lithium secondary battery in all fields in which the lithium secondary battery is used.

FIG. 1 is a picture easily expressing an influence of factors that influence reduction of a performance of a battery.

Referring to FIG. 1, it is safe to smoothly control a temperature at which an electrode material degrades during charging of a battery.

However, if the temperature of the battery is unstable for degradation, a charging state becomes unstable and an overcharging or over-discharging operation may occur.

Further, the degradation increases the resistance of the lithium secondary battery, and excessively increase the temperature of the lithium secondary battery during a charging operation so that the cycle life span of the lithium secondary battery rapidly decreases.

Accordingly, studies on an optimum charging condition for reducing charging time while decreasing an increase of temperature are essential to maximize the life span of the lithium secondary battery in the actual field of chargers.

The constant current-constant voltage (CC-CV) charging method that has been generally adopted at the time when the lithium ion batteries are common shows a low reduction of capacity, a short charging time, a convenient operation, and a low internal resistance for a long life span. However, when the CC-CV charging method is adopted, unsafety occurs at a positive electrode and a negative electrode of the interior of the battery.

When an artificial graphite negative and an Li positive electrode are selected, lithium plating occurs in most charging conditions, in particular, at a high current and a low temperature. Even in the CC charging range, a potential of the graphite negative electrode decreases to below 0 V. While a process of reinserting plated lithium into graphite occurs together with lithium plating, a low charging capacity is shown.

When the current exceeds a specific level, the increase of current cannot reduce charging time any further and a CV charging time becomes longer and the lithium plating deteriorates as well. Moreover, the decrease in the temperature of the battery further deteriorates the lithium plating.

In the CC-CV charging, after the voltage of the battery reaches an upper limit voltage (4.1 V to 4.2 V) with a constant current, a CV condition is maintained until the current of the battery reaches a preset low current value. Then, the CV condition may seriously extend the charging time. That is, the diffusion of the lithium ions in the electrode during charging causes a rate limiting step, and concentration polarization is essentially caused as the lithium ions are diffused for a long time. As the voltage of the battery reaches an upper limit voltage during rapid charging, the current may be lowered to a preset limit value before the active material is completely consumed.

The charging time of the lithium ion battery of more than two hours may be relevant to the safety and life span of the battery, and it is known that if the charging time exceeds two hours, a side reaction occurs and stability of the battery deteriorates due to the degradation of the battery.

In order to solve this problem, as an optimum charging method has been required to secure rapid charging and cycle stability of the lithium ion battery, a multistage constant current-constant voltage (MCC-CV) charging method has been developed.

The lithium battery is related to an internal resistance (Ohmic polarization) of the battery and a polarization phenomenon associated with movements of charges between the interfaces of the electrode and the electrolyte during charging. An overvoltage is caused due to the internal resistance of the battery and the active polarization, the conductivity of the ions is lower than the conductivity of the electrons, impurities may be contained in the electrode material, and a difference between the concentrations of lithium ions for electrodes may be caused due to the difference between the lithium ion diffusion speeds on a surface and the interior of the electrode material, which in turn causes a polarization phenomenon.

In the battery for a mobile device, when the current of the battery is higher than an existing current in a CC-CV (constant current-constant voltage), it influences aging and stability of the battery due to the lithium plating and the side reaction, and the charging efficiency of the SOC (a method of predicting a charging state with the voltage of the battery) based on voltage is high, but shows a high value due to the increase in the voltage due to the actual charging current, and as the actual charging amount corresponds to a voltage increment due to heat emission and current, the battery has a charging efficiency that is lower than the actual value in the actual OCV.

Further, in the battery for a mobile device, temperature greatly influences charging.

In particular, in the case of a high temperature of 60° C. or higher, aging of the battery accelerates and the life span of the battery rapidly decreases, and even in the case of a low temperature, lithium plating rapidly occurs during rapid charging.

Accordingly, it is necessary to optimize a charging method based on temperature.

PRIOR TECHNICAL DOCUMENTS

Patent Documents

Korean Patent Application Publication No. 2015-0033126 (published on Apr. 1, 2015 and entitled "Battery Temperature Adjusting Apparatus"

DETAILED DESCRIPTION OF THE INVENTION

Technical Problem

An embodiment of the present invention may provide a rapid charging system and a rapid charging method by which the battery may be rapidly charged by determining a charging current based on the environment of the battery and the state of the battery, and the life span of the battery may be prevented from being shortened, the charging efficiency becomes higher, and the charging time may be reduced by preventing degradation of the battery due to the charging efficiency and the reaction heat of the battery.

An embodiment of the present invention also provide a rapid charging system and a rapid charging method by which the battery may be rapidly charged by measuring temperature and determining a charging current correspond to the temperature, and may prevent the life span of the battery from being shortened, by preventing degradation due to the charging efficiency and the reaction heat of the battery, may increase charging efficiency, and may reduce charging time.

Technical Solution

A rapid charging method that considers thermal stability comprises:

detecting a temperature, by a temperature detection unit;

detecting a voltage of a secondary battery, by a voltage detection unit;

determining whether the voltage of the secondary battery detected through the battery detection unit is lower than a first voltage, by a control unit;

if the voltage of the secondary battery is lower than the first voltage, rapidly primarily charging the secondary battery by applying a temperature compensation factor to a first constant current, by the control unit;

if the voltage of the secondary battery is not lower than the first voltage, determining whether the voltage of the secondary battery is lower than a second voltage that is higher than the first voltage, by the control unit;

if the voltage of the secondary battery is lower than the second voltage, charging the secondary battery by applying the temperature compensation factor to a second constant current, by the control unit;

if the voltage of the secondary battery is not lower than the second voltage, determining whether the voltage of the secondary battery is lower than a third voltage, by the control unit;

if the voltage of the secondary battery is lower than the third voltage, charging the secondary battery by applying the temperature compensation factor to a third constant current, by the control unit; and if the voltage of the secondary voltage is not lower than the third voltage, terminating the charging operation.

The first voltage is 4.1 V, the second voltage is 4.15 V, the third voltage is 4.2 V, and the first constant current is 6 to 7 A, the second constant current is 4 to 5 A, and the third content current is 1 to 2 A.

When the temperature is below zero or 60° C. or higher, the temperature compensation factor decreases the first to third constant currents by multiplying the first to third constant currents by the temperature compensation factor.

A rapid charging system that considers thermal stability comprises:

a temperature detection unit for detecting temperature;

a power supply unit that supplies electric power for charging a secondary battery;

a charging that is connected to the power supply unit to charge the secondary battery;

a voltage detection unit that detects voltage information of the secondary battery and outputs the detected voltage information; and a control unit that determines a charging current based on the temperature detected by the temperature detection unit and the voltage information detected by the voltage detection unit to control the charging unit such that the control unit charges the secondary battery.

The system further comprises: a memory that stores a compensation factor for compensating for a charging current in response to a temperature, and the control unit compares the voltage information provided by the voltage detection unit with preset values, and charges the secondary battery by applying the compensation factor to a charging current determined based on the comparison result.

the control unit:

if the voltage of the secondary battery is lower than a first voltage, charges the secondary battery with a first constant current;

if the voltage of the secondary battery is not lower than the first current and lower than a second voltage, charges the secondary battery with a second constant current;

if the voltage of the secondary battery is not lower than the second current and lower than a third voltage, charges the secondary battery with a third constant current;

if the voltage of the secondary battery is not lower than the third voltage, terminate the charging operation of the secondary voltage; and applies the temperature compensation factor to the first to third constant currents.

The first voltage is 4.1 V, the second voltage is 4.15 V, the third voltage is 4.2 V, and the first constant current is 6 to 7 A, the second constant current is 4 to 5 A, and the third content current is 1 to 2 A.

Advantageous Effects of the Invention

An embodiment of the present invention provides a rapid charging system and a rapid charging method by which the battery may be rapidly charged by determining a charging current based on the environment of the battery and the state of the battery, and the life span of the battery may be prevented from being shortened, the charging efficiency becomes higher, and the charging time may be reduced by preventing degradation of the battery due to the charging efficiency and the reaction heat of the battery.

An embodiment of the present invention also provide a rapid charging system and a rapid charging method by which the battery may be rapidly charged by measuring temperature and determining a charging current correspond to the temperature, and may prevent the life span of the battery from being shortened, by preventing degradation due to the charging efficiency and the reaction heat of the battery, may increase charging efficiency, and may reduce charging time.

An embodiment of the present invention also provides a rapid charging system and a rapid charging method by which a high charging efficiency is achieved in a short time as compared with an existing charging method, and overcharging of the battery due to the charging of the battery and shortening of the life span of the battery due to a reaction heat may be prevented.

DESCRIPTION OF THE DRAWINGS

FIG. 1 is a view illustrating reduction of performance of a lithium secondary battery due to degradation.

FIG. 2 is a diagram of a rapid charging system that considers thermal stability according to an embodiment of the present invention.

FIG. 3 is a view illustrating a rapid charging method that considers thermal stability according to an embodiment of the present invention.

FIG. 4 is a view illustrating a temperature compensation factor that is applied to the rapid charging system that considers thermal stability according to an embodiment of the present invention.

FIG. 5 is a view for explaining a method of limiting a voltage to secure stability in the rapid charging system that considers thermal stability according to an embodiment of the present invention.

FIG. 6 is a view illustrating a maximum allowable charging current based on an SOC applied by the rapid charging system that considers thermal stability according to an embodiment of the present invention.

FIG. 7 is a view illustrating a maximum allowable charging current based on an SOC applied by the rapid charging system that considers thermal stability and a maximum charging current that considers stability according to an embodiment of the present invention.

FIG. 8 is a view illustrating an example of a charging method that considers stability when a charger that allows up to 6 A performs a charging operation in a rapid charging system that considers thermal stability according to an embodiment of the present invention.

FIG. 9 is a view illustrating an example of a charging method that considers stability when a charger that allows up to 7 A performs a charging operation in a rapid charging system that considers thermal stability according to an embodiment of the present invention.

FIGS. 10 and 11 are views for comparing charging time and charging rate of the rapid charging system that considers thermal stability according to an embodiment of the present invention with those of another method.

MODE OF THE INVENTION

Hereinafter, exemplary embodiments of the present invention will be described in detail with reference to the accompanying drawings so that those skilled in the art to which the present invention pertains may easily carry out the invention. However, the present invention may be implemented in various different forms, and is not limited to the embodiments. Further, in order to clearly describe the present invention, parts that are irrelevant to the description are excluded from the drawings and the similar parts are denoted by similar reference numerals throughout the specification.

Throughout the specification, when it is described that a part includes an element, it may mean that the part may further include second element without excluding the second element unless a specially contradictory description is made.

FIG. 2 is a diagram of a rapid charging system that considers thermal stability according to an embodiment of the present invention.

Referring to FIG. 2, the rapid charging system that considers thermal stability according to an embodiment of the present invention includes a temperature detection unit 110, a power supply unit 140, a charging unit 130, a voltage detection unit 120, a memory 160, and a control unit 150.

The temperature detection unit 110 detects temperature, and in detail, may be implemented by a temperature sensor that measures an external temperature of a secondary battery 200.

The power supply unit 140 supplies electric power for charging the secondary battery 200.

The charging unit 130 charges the secondary battery 200 by using the electric power supplied by the power supply unit.

The voltage detection unit 120 detects voltage information of the secondary battery 200 and outputs the detected voltage information.

The memory 160 stores a compensation factor that compensates for a charging current in response to temperature, and in detail, stores a temperature compensation factor in the form of FIG. 4 in a form of a table or a graph.

The control unit 150 determines a charging current based on the temperature detected by the temperature detection unit 110 and the voltage information detected by the voltage detection unit to control the charging unit 130 such that the charging unit 130 charges the secondary battery 200.

Further, the control unit 150 compares the voltage information provided by the voltage detection unit 120 with preset values, and apply the compensation factor to the charged current determined based on the comparison result to charge the secondary battery 200.

The Control Unit 150 charges the secondary battery 200 with a first constant current if the voltage of the secondary battery 200 is lower than a first voltage, charges the secondary battery 200 with a second constant current if the voltage of the secondary battery 200 is not lower than the first voltage and lower than a second voltage, charges the secondary battery 200 with a third constant current if the voltage of the secondary battery 200 is not lower than the second voltage and lower than a third voltage, terminates charging of the secondary battery 200 if the voltage of the secondary battery 200 is not lower than the third voltage, and applies the temperature compensation factor to the first to third constant currents.

The first voltage is 4.1 V, the second voltage is 4.15 V, the third voltage is 4.2 V, and the first constant current is 6 to 7 A, the second constant current is 4 to 5 A, and the third constant current is 1 to 2 A.

Hereinafter, an operation of the above-configured rapid charging system that considers thermal stability according to an embodiment of the present invention will be described.

FIG. 3 is a view illustrating a rapid charging method that considers thermal stability according to an embodiment of the present invention. FIG. 4 is a view illustrating a temperature compensation factor that is applied to the rapid charging system that considers thermal stability according to an embodiment of the present invention. FIG. 5 is a view for explaining a method of limiting a voltage to secure stability in the rapid charging system that considers thermal stability according to an embodiment of the present invention. FIG. 6 is a view illustrating a maximum allowable charging current based on an SOC applied by the rapid charging system that considers thermal stability according to an embodiment of the present invention. FIG. 7 is a view illustrating a maximum allowable charging current based on an SOC applied by the rapid charging system that considers thermal stability and a maximum charging current that considers stability according to an embodiment of the present invention. FIG. 8 is a view illustrating an example of a charging method that considers stability when a charger that allows up to 6 A performs a charging operation in a rapid charging system that considers thermal stability according to an embodiment of the present invention. FIG. 9 is a view illustrating an example of a charging method that considers stability when a charger that allows up to 7 A performs a charging operation in a rapid charging system that considers thermal stability according to an embodiment of the present invention. FIGS. 10 and 11 are views for comparing charging time and charging rate of the rapid charging system that considers thermal stability according to an embodiment of the present invention with those of another method.

Referring to FIG. 3, first, the temperature detection unit 110 detects temperature and outputs the detected temperature to the control unit 150. Then, the temperature is an external temperature of the battery, and corresponds to a temperature of a surrounding environment.

Further, the voltage detection unit 120 detects a voltage of the secondary battery 200 and outputs the detected voltage to the control unit 150 (S300).

Then, the control unit 150 determines a temperature compensation factor corresponding to temperature with reference to the memory 160. Then, a temperature compensation factor for compensating for charging current for temperatures are stored in the memory 160 in advance.

Further, the control unit 150 determines a first charging current corresponding to voltage (S301). Here, the first charging current is an initial rapid charging current and a state of the secondary battery 200 is regarded and determined as a state that requires charging.

Next, the control unit 150 multiplies the first charging current by the temperature compensation factor based on temperature and determines a charging current that is to be charged by the charging unit 130 (S302).

Further, the control unit 150 determines whether the voltage of the secondary battery 200, which has been detected through the voltage detection unit 120, is lower than 4.1 V (S303). The determination process is a process for determining a charging state of the secondary battery 200 and performing a charging operation with another charging current when the voltage of the secondary battery 200 is not lower than 4.1 V.

If the voltage of the secondary battery 200 is lower than 4.1 V, the control unit 150 rapidly charges the secondary battery 200 with a charging current determined in the process, in which a temperature compensation factor is applied to the first constant current (S302).

Meanwhile, if the voltage of the secondary battery 200 is not lower than 4.1 V, the control unit 150 determines whether the voltage of the secondary battery 200 is lower than 4.15 V (S305).

If the voltage of the secondary battery 200 is lower than 4.15 V, the control unit 150 recognizes a state of the secondary battery 200 as a voltage between 4.1 V and 4.15 V.

Thereafter, the control unit 150 applies the temperature compensation factor to the second constant current and charges the secondary battery 200 by controlling the charging unit 130 (S304).

If the voltage of the secondary battery 200 is not lower than 4.15 V, the control unit 150 determines whether the voltage of the secondary battery 200 is lower than 4.2 V (S307). The determination process is a process of determining a charging state of the secondary battery 200 and terminating the charging operation when the voltage of the secondary battery 200 is not lower than the voltage (4.2 V).

If the voltage of the secondary battery 200 is lower than 4.2V, the control unit 150 applies the temperature compensation factor to the third constant current and charges the secondary battery 200 by controlling the charging unit 130 (S306).

If it is determined that the voltage of the secondary battery 200 is not lower than 4.2 V, the charging operation is terminated.

The processes are illustrated in sequence for convenience' sake, and the sequence may be changed, and the process may be performed while the secondary battery 200 is charged with the first to third charging currents if necessary.

Further, when the voltage of the secondary battery 200 is 4.1 V or 4.15 V in the determination steps (S303 and S305), the following determination steps may be performed while the secondary battery 200 is charged with the second charging current or the third charging current.

Further, although it has been described that the first voltage is 4.1 V, the second voltage is 4.15 V, and the third voltage is 4.2 V in the process, they may be modified based on the type and charging voltage of the secondary battery, and although it has been described that the first constant current is 6 to 7 A, the second constant voltage is 4 to 5 A, and the third constant voltage is 1 to 2 A, they also may be modified.

According to the embodiment of the present invention, a temperature is measured while thermal stability is considered, and a charging current is multiplied by a temperature compensation factor that compensates for the charging current based on the temperature, and the temperature compensating method may be variously modified.

Referring to FIG. 4, the temperature compensation factor decreases the first to third constant currents when the temperature is below zero or 60° C., and accordingly the stability of the secondary battery 200 is secured.

For example, when the temperature is below 40° C., the temperature compensation factor is 60%, and the charging current determined in response to the voltage of the secondary battery 200 is reduced by 40%.

Further, even when the temperature is 70° C., the temperature compensation factor is 90%, and the charging current determined in response to the voltage of the secondary battery 200 is reduced by 10%.

Further, if necessary, the temperature compensation factor may increase the charging current by 10% when the temperature is above zero and less than 60° C.

The graph of FIG. 4 may be modified based on the type of the secondary battery and the surrounding environment.

FIG. 5 is a picture for explaining a method for limiting voltage to secure the stability of the secondary battery 200 in an embodiment of the present invention.

The red line indicates a maximum voltage that has little possibility of generating a lithium plate, and aging of the battery may be maximally restrained even though the charging operation is performed with a maximum allowable current.

The blue line indicates a maximum allowable voltage of the battery. Then, the lithium plating has to be reduced by reducing charging current. (When with reference to 4.2 V, when the maximum allowable charging voltage is 4.3 V, the voltage is shifted by 0.1 V).

FIG. 6 illustrates a maximum allowable charging current based on an SOC in an embodiment of the present invention, and indicates experimental values and trend lines.

Referring to FIG. 6, it may be identified from the comparison of the experimental values and the trend line that the experimental values are in the vicinity of the trend line.

FIG. 7 illustrates a maximum allowable charging current and a maximum charging current that considers stability based on an SOC in an embodiment of the present invention. In the embodiment of the present invention, the first charging current corresponds to a rapid charging operation that considers stability and the second charging current and the third charging current correspond to a maximum allowable current line, but the method may be modified if necessary.

FIG. 8 is a view illustrating a charging method that considers stability when a charger that allows up to 6 A performs a charging operation by using a method of determining a charging current based on temperature and a state of a battery according to an embodiment of the present invention.

Referring to FIG. 8, a charging operation is performed with a current of 6 A when the current becomes a maximum charging current that considers stability based on the maximum allowable current of the charger and the state of the battery (SOC 30%).

Further, in the next step, a charging operation is performed until the current becomes a maximum current time point (4.15 V) that allows 4 A (SOC 70%).

Further, in the remaining steps, a CC-CV charging operation is performed with a current of 2 A that is a default value (up to 4.2 V). The current value may be modified if necessary.

An example of modifying the charging current is illustrated in FIG. 9.

Referring to FIG. 9, a charging operation is performed with a current of 7 A when the current becomes a maximum charging current that considers stability based on the maximum allowable current of the charger and the state of the battery (SOC 30%).

Further, in the next step, a charging operation is performed until the current becomes a maximum current time point (4.15 V) that allows 5 A (SOC 70%).

Further, in the remaining steps, a CC-CV charging operation is performed with a current of 2 A that is a default value (up to 4.2 V).

FIGS. 10 and 11 are views for comparing the charging time and charging rate of the embodiment of the present invention with another charging method.

Referring to FIG. 10, it can be seen that the charging operation is thermally stabilized as the temperature does not significantly increase even though the charging rate increases in the embodiment of the present invention.

Further, referring to FIG. 11, it can be seen that a charging operation may be stably and rapidly performed as the charging rate increases in a short time in the embodiment of the present invention.

According to the embodiment of the present invention, the battery may be rapidly charged by determining a charging current based on the environment of the battery and the state of the battery, and the life span of the battery may be prevented from being shortened, the charging efficiency becomes higher, and the charging time may be reduced by preventing degradation of the battery due to the charging efficiency and the reaction heat of the battery.

Further, according to the embodiment of the present invention, the battery may be rapidly charged by measuring temperature and determining a charging current correspond to the temperature, and may prevent the life span of the battery from being shortened, by preventing degradation due to the charging efficiency and the reaction heat of the battery, may increase charging efficiency, and may reduce charging time.

Further, according to the embodiment of the present invention, a high charging efficiency is achieved in a short time as compared with an existing charging method, and overcharging of the battery due to the charging of the battery and shortening of the life span of the battery due to a reaction heat may be prevented.

The embodiments of the present invention, which have been described above, are not implemented only through apparatuses and methods, but may be implemented through programs that realize the functions corresponding to the configurations of the embodiments of the present invention and recording media, in which the programs are recorded, and the implementations may be easily made from the above description of the embodiments by an expert of the technical art to which the present invention pertains.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

INDUSTRIAL APPLICABILITY

An embodiment of the present invention may provide a rapid charging system and a rapid charging method by which the battery may be rapidly charged by determining a charging current based on the environment of the battery and the state of the battery, and the life span of the battery may be prevented from being shortened, the charging efficiency becomes higher, and the charging time may be reduced by preventing degradation of the battery due to the charging efficiency and the reaction heat of the battery.

An embodiment of the present invention also provide a rapid charging system and a rapid charging method by which the battery may be rapidly charged by measuring temperature and determining a charging current correspond to the temperature, and may prevent the life span of the battery from being shortened, by preventing degradation due to the charging efficiency and the reaction heat of the battery, may increase charging efficiency, and may reduce charging time.

An embodiment of the present invention also provides a rapid charging system and a rapid charging method by which a high charging efficiency is achieved in a short time as compared with an existing charging method, and overcharging of the battery due to the charging of the battery and shortening of the life span of the battery due to a reaction heat may be prevented.

The invention claimed is:

1. A method of rapidly charging a battery, the method comprising:
   detecting a temperature, by a temperature detection unit;
   detecting a voltage of a secondary battery, by a voltage detection unit;
   determining whether the voltage of the secondary battery detected through the battery detection unit is lower than a first voltage, by a control unit;
   if the voltage of the secondary battery is lower than the first voltage, rapidly primarily charging the secondary battery by applying a temperature compensation factor to a first constant current, by the control unit;
   if the voltage of the secondary battery is not lower than the first voltage, determining whether the voltage of the secondary battery is lower than a second voltage that is higher than the first voltage, by the control unit;
   if the voltage of the secondary battery is lower than the second voltage, charging the secondary battery by applying the temperature compensation factor to a second constant current, by the control unit;
   if the voltage of the secondary battery is not lower than the second voltage, determining whether the voltage of the secondary battery is lower than a third voltage, by the control unit;
   if the voltage of the secondary battery is lower than the third voltage, charging the secondary battery by applying the temperature compensation factor to a third constant current, by the control unit; and
   if the voltage of the secondary voltage is not lower than the third voltage, terminating the charging operation.

2. The method of claim 1, wherein the first voltage is 4.1 V, the second voltage is 4.15 V, the third voltage is 4.2 V, and the first constant current is 6 to 7 A, the second constant current is 4 to 5 A, and the third content current is 1 to 2 A.

3. The method of claim 1, wherein when the temperature is below zero or 60° C. or higher, the temperature compensation factor decreases the first to third constant currents by multiplying the first to third constant currents by the temperature compensation factor.

4. A system for rapidly charging a battery, the system comprising:
   a temperature detection unit for detecting a temperature;
   a power supply unit that supplies electric power for charging a secondary battery;
   a charging unit that is connected to the power supply unit to charge the secondary battery;
   a voltage detection unit that detects voltage information of the secondary battery and outputs the detected voltage information;
   a control unit that determines a charging current based on the temperature detected by the temperature detection unit and the voltage information detected by the voltage detection unit to control the charging unit such that the control unit charges the secondary battery; and
   a memory that stores a compensation factor for compensating for a charging current in response to a temperature,
   wherein the control unit:
   compares the voltage information provided by the voltage detection unit with preset values, and charges the secondary battery by applying the compensation factor to a charging current determined based on the comparison result;
   if the voltage of the secondary battery is lower than a first voltage, charges the secondary battery with a first constant current;
   if the voltage of the secondary battery is not lower than the first voltage and lower than a second voltage, charges the secondary battery with a second constant current;
   if the voltage of the secondary battery is not lower than the second voltage and lower than a third voltage, charges the secondary battery with a third constant current;
   if the voltage of the secondary battery is not lower than the third voltage, terminates the charging operation of the secondary battery; and
   applies the compensation factor to the first to third constant currents.

5. The system of claim 4, wherein the first voltage is 4.1 V, the second voltage is 4.15 V, the third voltage is 4.2 V, and
   wherein the first constant current is 6 to 7 A, the second constant current is 4 to 5 A, and the third content current is 1 to 2 A.

6. A system for rapidly charging a battery, the system comprising:
   a temperature detection unit for detecting a temperature;
   a power supply unit that supplies electric power for charging a secondary battery;
   a charging unit that is connected to the power supply unit to charge the secondary battery;

a voltage detection unit that detects voltage information of the secondary battery and outputs the detected voltage information; and a control unit that determines a charging current based on the temperature detected by the temperature detection unit and the voltage information detected by the voltage detection unit to control the charging unit such that the control unit charges the secondary battery, wherein the control unit:

if the voltage of the secondary battery is lower than a first voltage, charges the secondary battery with a first constant current;

if the voltage of the secondary battery is not lower than the first voltage and lower than a second voltage, charges the secondary battery with a second constant current;

if the voltage of the secondary battery is not lower than the second voltage and lower than a third voltage, charges the secondary battery with a third constant current;

if the voltage of the secondary battery is not lower than the third voltage, terminates the charging operation of the secondary battery; and applies a temperature compensation factor to the first to third constant currents.

* * * * *